(12) United States Patent
Jung et al.

(10) Patent No.: US 12,557,267 B2
(45) Date of Patent: Feb. 17, 2026

(54) INTEGRATED CIRCUIT DEVICE AND METHOD OF MANUFACTURING THE SAME

(71) Applicant: Samsung Electronics Co., Ltd., Suwon-si (KR)

(72) Inventors: Kyooho Jung, Seoul (KR); Jongyeong Min, Suwon-si (KR); Jiye Baek, Suwon-si (KR); Yeseul Lee, Suwon-si (KR); Jinwook Lee, Seoul (KR); Wonsik Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 436 days.

(21) Appl. No.: 18/333,213

(22) Filed: Jun. 12, 2023

(65) Prior Publication Data
US 2024/0015949 A1    Jan. 11, 2024

(30) Foreign Application Priority Data
Jul. 5, 2022  (KR) .......................... 10-2022-0082757

(51) Int. Cl.
*H10B 12/00* (2023.01)

(52) U.S. Cl.
CPC ....... *H10B 12/315* (2023.02); *H10B 12/0335* (2023.02); *H10B 12/34* (2023.02)

(58) Field of Classification Search
CPC .............................. H10B 12/315; H10B 12/34
See application file for complete search history.

(56) References Cited

U.S. PATENT DOCUMENTS

| | | | |
|---|---|---|---|
| 9,142,558 B2 * | 9/2015 | Yang ...................... | H10D 1/716 |
| 11,069,768 B2 * | 7/2021 | Park ....................... | H10B 53/30 |
| 11,081,338 B2 * | 8/2021 | Kim ................... | H01L 21/02164 |
| 2021/0125996 A1 * | 4/2021 | An ......................... | H10D 1/716 |

* cited by examiner

*Primary Examiner* — Steven M Page
(74) *Attorney, Agent, or Firm* — HARNESS, DICKEY & PIERCE, P.L.C.

(57) ABSTRACT

An integrated circuit device may include a plurality of lower electrodes above a substrate, a supporter between the plurality of lower electrodes, an upper electrode on the plurality of lower electrodes, and a capacitor dielectric film between the upper electrode and the plurality of lower electrodes. The supporter may include one of a metal oxide, a metal nitride, and a metal oxynitride. A portion of the capacitor dielectric film may include a dopant. The dopant in the portion of the capacitor dielectric film and a metal in the supporter may be a same metal.

20 Claims, 18 Drawing Sheets

INTEGRATED CIRCUIT DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2022-0082757, filed on Jul. 5, 2022 in the Korean Intellectual Property Office, the disclosure of which is incorporated by reference herein in its entirety.

BACKGROUND

Inventive concepts relate to an integrated circuit device and a method of manufacturing the same, and more particularly, to an integrated circuit device including a capacitor and a method of manufacturing the integrated circuit device.

With the recent rapid development of miniaturized semiconductor process technology, the high integration density of integrated circuit devices has been accelerated, and the area of each cell has decreased. Accordingly, an area that may be occupied by a capacitor in each cell has also decreased. For example, with the increase in the integration density of integrated circuit devices, such as dynamic random access memory (DRAM), the area of each cell has decreased while necessary capacitance has been maintained or increased. What is therefore needed is a structure for maintaining desired electrical characteristics by overcoming the spatial limit of a capacitor and the limit of design rules and increasing the capacitance of the capacitor.

SUMMARY

Inventive concepts provide an integrated circuit device for reducing leakage current flowing through a capacitor dielectric film between neighboring lower electrodes by allowing part of a material of a supporter supporting the lower electrodes to diffuse into the capacitor dielectric film and a method of manufacturing the same.

Inventive concepts are not limited to what is mentioned above and will be clearly understood by those skilled in the art from the descriptions below.

According to an embodiment of inventive concepts, an integrated circuit device may include a plurality of lower electrodes above a substrate, a supporter between the plurality of lower electrodes, an upper electrode on the plurality of lower electrodes, and a capacitor dielectric film between the upper electrode and the plurality of lower electrodes. The supporter may include one of a metal oxide, a metal nitride, and a metal oxynitride. A portion of the capacitor dielectric film may include a dopant. The dopant in the portion of the capacitor dielectric film and a metal in the supporter may be a same metal.

According to an embodiment of inventive concepts, an integrated circuit device may include a plurality of lower electrodes above a substrate, a supporter between the plurality of lower electrodes, an upper electrode on the plurality of lower electrodes, and a capacitor dielectric film between the upper electrode and the plurality of lower electrodes. The supporter may include a first supporter and a second supporter. The first supporter may include one of a metal oxide, a metal nitride, and a metal oxynitride. The first supporter may be in contact with the capacitor dielectric film. The second supporter may not include metal. The second supporter may be surrounded by the first supporter and may not be in contact with the capacitor dielectric film. A portion of the capacitor dielectric film may include a dopant. The dopant in the portion of the capacitor dielectric film and a metal in the first supporter may be a same metal.

According to an embodiment of inventive concepts, an integrated circuit device may include a substrate including an active region defined by an isolation film; a gate structure on the substrate, the gate structure crossing the active region and extending in a first direction; a source/drain in the active region at opposite sides of the gate structure, respectively; a bit line structure on the substrate, the bit line structure extending in a second direction, the second direction being perpendicular to the first direction; a plurality of contact structures on the source/drain, respectively; a plurality of capacitor structures respectively on the plurality of contact structures; and a supporter connecting and supporting the plurality of lower electrodes. The plurality of capacitor structures may include a plurality of lower electrodes, respectively. Each of the plurality of capacitor structures may include a corresponding lower electrode among the plurality of lower electrodes, a capacitor dielectric film, and an upper electrode. The supporter may include one of a metal oxide, a metal nitride, and a metal oxynitride. A portion of the capacitor dielectric film may include a dopant. The dopant in the portion of capacitor dielectric film and a metal in the supporter may be a same metal.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Hereinafter, embodiments are described in detail with reference to the accompanying drawings.

Figure 1:
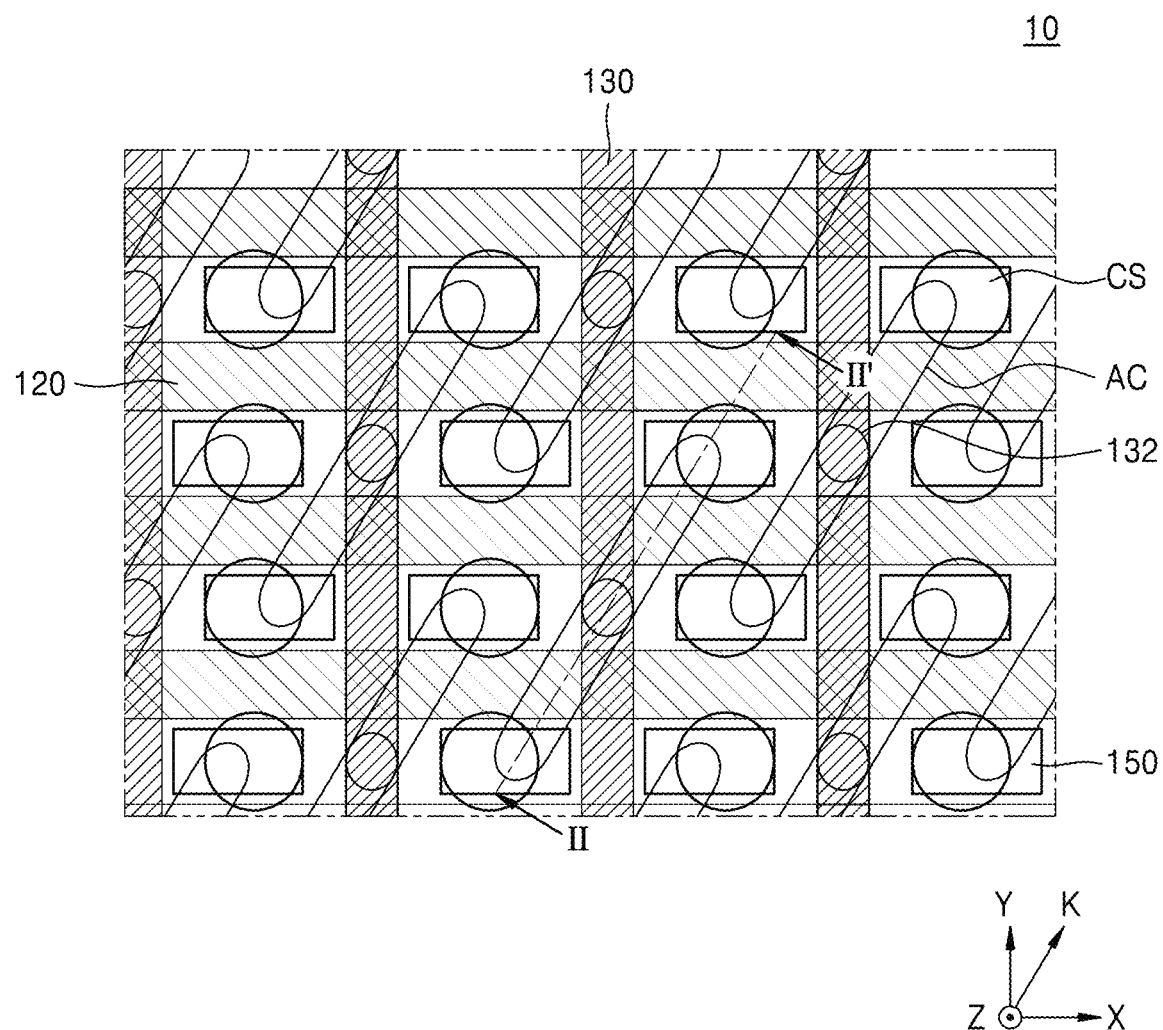
FIG. 1 is a layout diagram of an integrated circuit device according to an embodiment.
Figure 2:
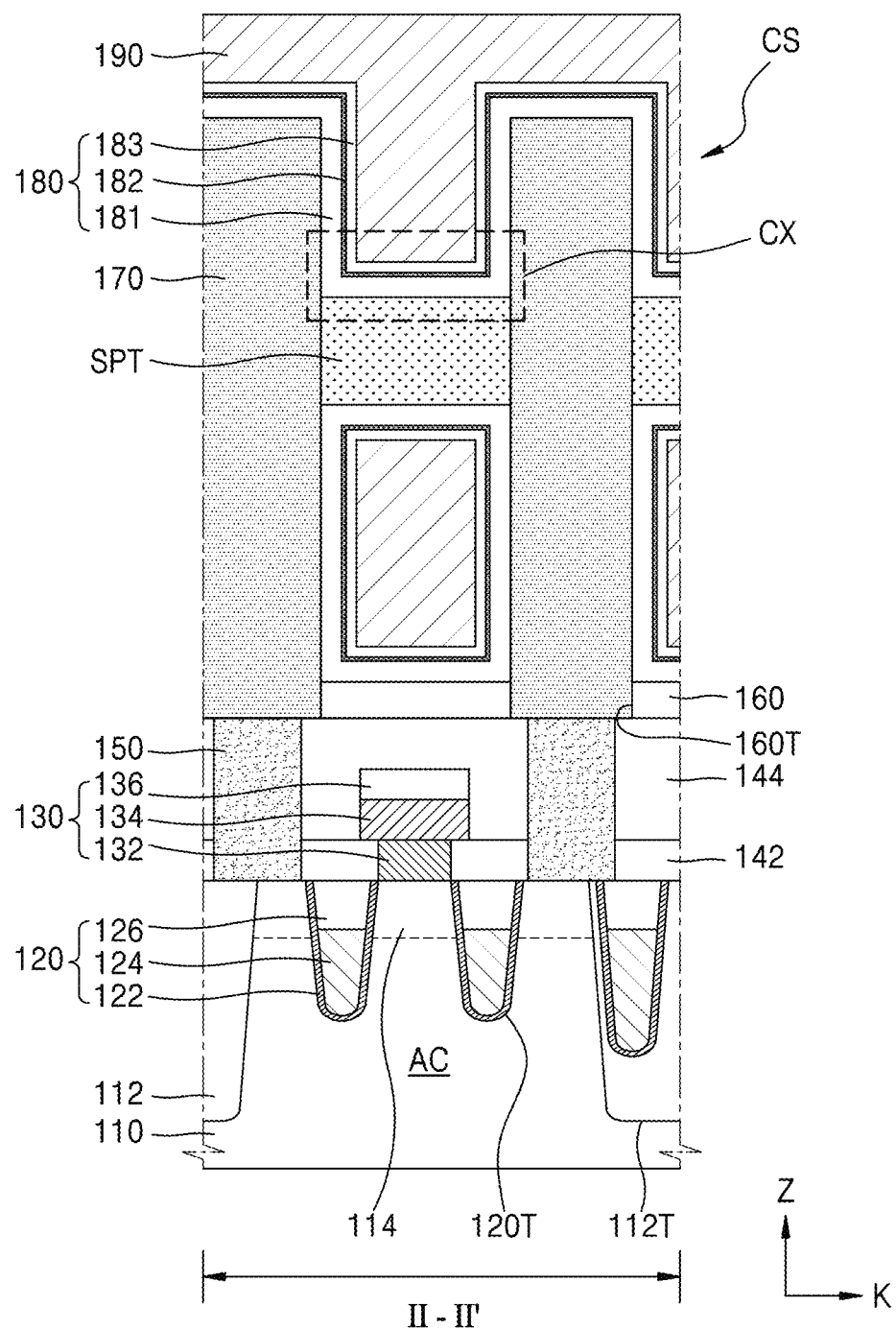
FIG. 2 is a cross-sectional view of an integrated circuit device according to an embodiment.
Figure 3:
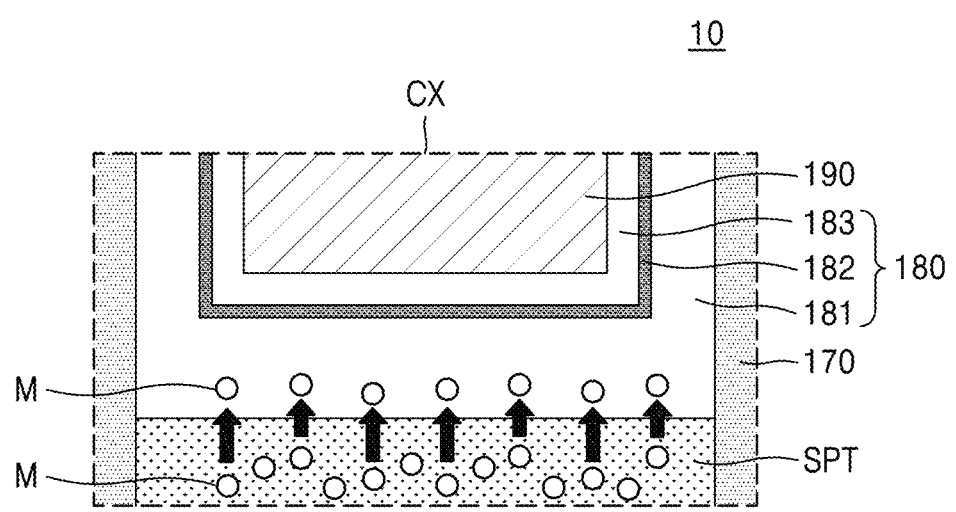
FIG. 3 is an enlarged cross-sectional view of a region CX in FIG. 2.

FIG. 1 is a layout diagram of an integrated circuit device 10 according to an embodiment, FIG. 2 is a cross-sectional view taken along a line II-II' in FIG. 1, and FIG. 3 is an enlarged view of a region CX in FIG. 2.

Referring to FIGS. 1 to 3, the integrated circuit device 10 may include a lower electrode 170 above a substrate 110, a supporter SPT supporting the lower electrode 170, a capacitor dielectric film 180 on the lower electrode 170, and an upper electrode 190 on the capacitor dielectric film 180.

The substrate 110 may include an active region AC defined by an isolation film 112. The substrate 110 may correspond to a wafer including silicon (Si). In some embodiments, the substrate 110 may correspond to a wafer including a semiconductor element, such as germanium (Ge), or a compound semiconductor, such as silicon carbide (SiC), gallium arsenide (GaAs), indium arsenide (InAs), or indium phosphide (InP). The substrate 110 may have a silicon on insulator (SOI) structure. The substrate 110 may include a conductive region, e.g., an impurity-doped well or an impurity-doped structure.

For example, the isolation film 112 may have a shallow trench isolation (STI) structure. The isolation film 112 may include an insulating material filling an isolation trench 112T in the substrate 110. The insulating material may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ) but is not limited thereto.

The active region AC may have a relatively long island shape. The long axis of the active region AC may be arranged in a K-direction that is parallel with a top surface of the substrate 110. The active region AC may be doped with p-type or n-type impurities.

The substrate 110 may include a gate line trench 120T extending in an X-direction. The gate line trench 120T may cross the active region AC and have a certain depth from the top surface of the substrate 110. A portion of the gate line trench 120T may extend to the inside of the isolation film 112. The bottom of a gate line trench 120T in the isolation film 112 may be at a lower level than the bottom of a gate line trench 120T in the active region AC.

A source/drain region 114 may be on the active region AC at each of opposite sides of a gate line trench 120T. The source/drain region 114 may include an impurity region, which is doped with impurities of a different conductivity type than the active region AC. The source/drain region 114 may be doped with n-type or p-type impurities.

A gate structure 120 may be formed in the gate line trench 120T. The gate structure 120 may include a gate insulating layer 122, a gate electrode layer 124, and a gate capping layer 126, which are sequentially formed on the inner wall of the gate line trench 120T.

The gate insulating layer 122 may be conformally formed on the inner wall of the gate line trench 120T to a certain thickness. The gate insulating layer 122 may include at least one selected from silicon oxide, silicon nitride, silicon oxynitride, oxide/nitride/oxide (ONO), and a high-k material having a higher dielectric constant than silicon oxide.

The gate electrode layer 124 may be formed on the gate insulating layer 122 to fill the gate line trench 120T up to a certain height from the bottom of the gate line trench 120T. The gate electrode layer 124 may include a work function control layer (not shown) on the gate insulating layer 122 and a buried metal layer (not shown) on the work function control layer, wherein the buried metal layer fills a bottom portion of the gate line trench 120T.

The gate capping layer 126 may be on the gate electrode layer 124 and may fill the remaining portion of the gate line trench 120T. For example, the gate capping layer 126 may include at least one selected from silicon oxide, silicon oxynitride, and silicon nitride.

A bit line structure 130 may be on the source/drain region 114 and may extend in a Y-direction that is perpendicular to the X-direction. The bit line structure 130 may include a bit line contact 132, a bit line 134, and a bit line capping layer 136, which are sequentially stacked on the substrate 110. For example, the bit line contact 132 may include polysilicon, the bit line 134 may include a metal material, and the bit line capping layer 136 may include silicon nitride or silicon oxynitride.

A first interlayer insulating film 142 may be on the substrate 110. The bit line contact 132 may pass through the first interlayer insulating film 142 to be connected to the source/drain region 114. The bit line 134 and the bit line capping layer 136 may be on the first interlayer insulating film 142. A second interlayer insulating film 144 may be on the first interlayer insulating film 142 and may cover the side surfaces of the bit line 134 and the side and top surfaces of the bit line capping layer 136.

A contact structure 150 may be on the source/drain region 114. The first and second interlayer insulating films 142 and 144 may surround the side wall of the contact structure 150. In some embodiments, the contact structure 150 may include a lower contact (not shown), a metal silicide layer (not shown), and an upper contact (not shown), which are sequentially stacked on the substrate 110.

A capacitor structure CS may be on the second interlayer insulating film 144. The capacitor structure CS may include the lower electrode 170 electrically connected to the contact structure 150, the capacitor dielectric film 180 conformally covering the lower electrode 170, and the upper electrode 190 on the capacitor dielectric film 180. An etch stop film 160 having an opening 160T may be on the second interlayer insulating film 144, and a bottom portion of the lower electrode 170 may be in the opening 160T of the etch stop film 160.

It is illustrated that a plurality of capacitor structures CS are respectively arranged on a plurality of contact structures 150, which are repeatedly arranged in the X- and Y-directions, but embodiments are not limited thereto. Differently, a plurality of capacitor structures CS may be arranged in a honeycomb pattern on a plurality of contact structures 150, which are repeatedly arranged in the X- and Y-directions.

The lower electrode 170 may include metal nitride, metal, or a combination thereof. For example, the lower electrode 170 may include at least one selected from TiN, TaN, WN, Ru, Pt, and Ir. The lower electrode 170 may be formed by chemical vapor deposition (CVD) or atomic layer deposition (ALD).

The lower electrode 170 may have a very large aspect ratio. For example, the aspect ratio of the lower electrode 170 may be about 10 to about 30. In detail, the diameter of the lower electrode 170 may be about 20 nm to about 100 nm, and the height of the lower electrode 170 may be about 500 nm to about 4000 nm, but the lower electrode 170 is not limited to these dimensions. As the lower electrode 170 has a large aspect ratio, the lower electrode 170 may collapse or break.

The supporter SPT may limit and/or prevent the lower electrode 170 from collapsing or breaking. The supporter SPT may have a plate shape including a supporter pattern in contact with the lower electrode 170. In the integrated circuit device 10 according to inventive concepts, the supporter SPT may not only function as a supporter but also provide a metal dopant to the capacitor dielectric film 180. This is described in detail below.

The capacitor dielectric film 180 may be on the outer surface of the lower electrode 170 and the outer surface of the supporter SPT. The capacitor dielectric film 180 may have a stack structure of first to third dielectric films 181, 182, and 183. The capacitor dielectric film 180 may include a high-k material having a higher dielectric constant than silicon oxide. For example, the capacitor dielectric film 180 may have a dielectric constant of about 10 to about 25.

In some embodiments, the first and third dielectric films 181 and 183 may include substantially the same material as each other, and the second dielectric film 182 may include a different material than the first and third dielectric films 181 and 183. For example, the first and third dielectric films 181 and 183 may include zirconium oxide ($ZrO_2$), and the second dielectric film 182 may include aluminum oxide ($Al_2O_3$).

The upper electrode 190 may be on the capacitor dielectric film 180. The upper electrode 190 may be conformally formed on the capacitor dielectric film 180 and may cover the lower electrode 170 with the capacitor dielectric film 180 between the upper electrode 190 and the lower electrode 170. In some embodiments, the upper electrode 190 may be in direct contact with the third dielectric film 183. The upper electrode 190 may include a metal nitride, a metal, or a combination thereof. For example, the upper electrode 190 may include at least one selected from TiN, TaN, WN, Ru, Pt, and Ir.

With the recent rapid development of miniaturized semiconductor process technology, the high integration density of the integrated circuit device 10 has been accelerated, and the area of each cell has decreased. Accordingly, an area that may be occupied by a capacitor structure CS in each cell has also decreased. For example, with the increase in the integration density of the integrated circuit device 10, such as dynamic random access memory (DRAM), the area of each cell has decreased while necessary capacitance has been maintained or increased.

Therefore, in a structure in which neighboring lower electrodes 170 are very close to each other because of the decrease in the area of each cell, leakage current may undesirably flow through the capacitor dielectric film 180. To limit and/or prevent leakage current from flowing through the capacitor dielectric film 180, an interface layer for limiting and/or preventing leakage current may be formed in the capacitor dielectric film 180, but the interface layer may hinder the crystallization of a high-k material of the capacitor dielectric film 180 and thus cause the capacitance of the capacitor dielectric film 180 to decrease.

In other words, what is needed is a structure for maintaining desired electrical characteristics by overcoming the spatial limit of the integrated circuit device 10 having a high integration density and the limit of design rules and increasing the capacitance of the integrated circuit device 10.

In the integrated circuit device 10 according to inventive concepts, a material for reducing leakage current of the capacitor dielectric film 180 is included first in the supporter SPT and then moved into the capacitor dielectric film 180 through thermal diffusion so that a short circuit between neighboring lower electrodes 170 may be limited and/or prevented without hindering the crystallization of the capacitor dielectric film 180.

In detail, the supporter SPT may include a metal oxide, metal nitride, or metal oxynitride. A metal M included in the supporter SPT may include at least one selected from aluminum (Al), Si, cobalt (Co), magnesium (Mg), calcium (Ca), yttrium (Y), tantalum (Ta), tin (Sn), molybdenum (Mo), strontium (Sr), lanthanum (La), gadolinium (Gd), and zinc (Zn).

After a high-k material constituting the capacitor dielectric film 180 is formed, the metal M included in the supporter SPT may be diffused as a dopant into the capacitor dielectric film 180 through an annealing process such that a portion of the capacitor dielectric film 180 may be doped with the metal M. For example, the supporter SPT may be in direct contact with the first dielectric film 181 of the capacitor dielectric film 180, and the metal M may be thermally diffused into the first dielectric film 181 through an interface between the supporter SPT and the first dielectric film 181.

In some embodiments, the inside of the first dielectric film 181 may be doped with a dopant, e.g., the metal M, but the inside of each of the second and third dielectric films 182 and 183 may not substantially be doped with the metal M. In other words, the concentration of the metal M in the capacitor dielectric film 180 may decrease away from the supporter SPT.

Eventually, in the integrated circuit device 10 according to inventive concepts, part of the metal M, which is a material included in the supporter SPT, may be diffused into the capacitor dielectric film 180, thereby reducing leakage current flowing through the capacitor dielectric film 180 between neighboring lower electrodes 170. Accordingly, the integrated circuit device 10 may have high capacitance and improved electrical characteristics.

Figure 4:
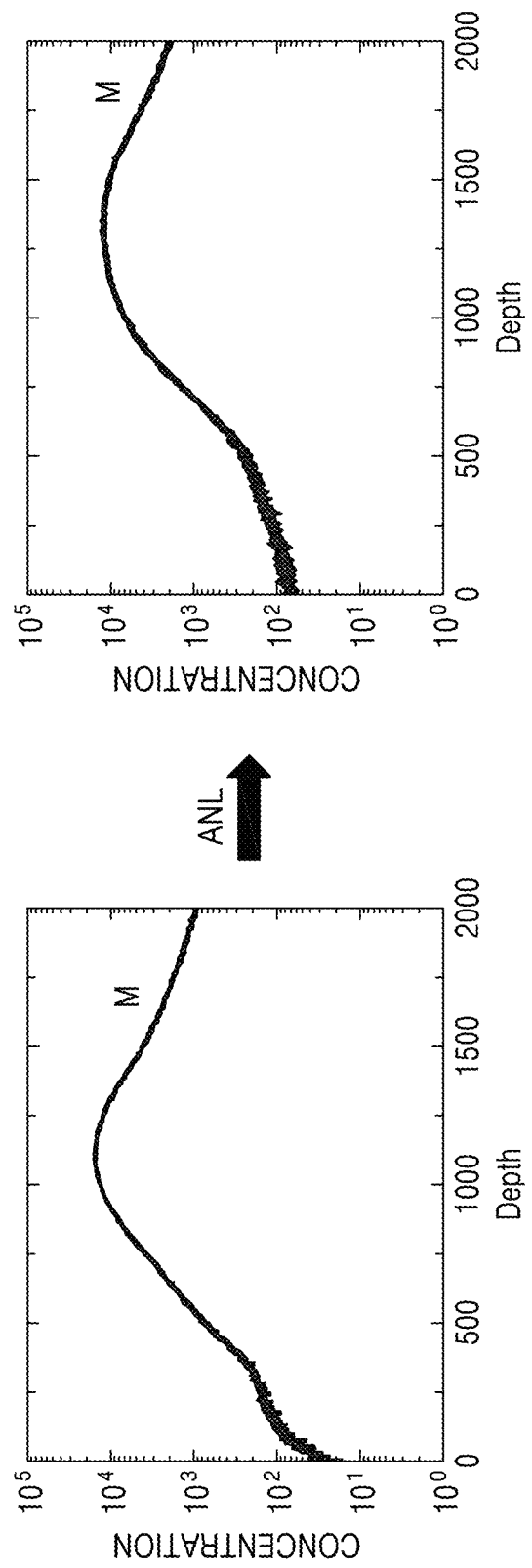
FIG. 4 is a graph showing the change in the concentration of a metal dopant according to a heat treatment in an integrated circuit device, according to an embodiment.
Figure 5:
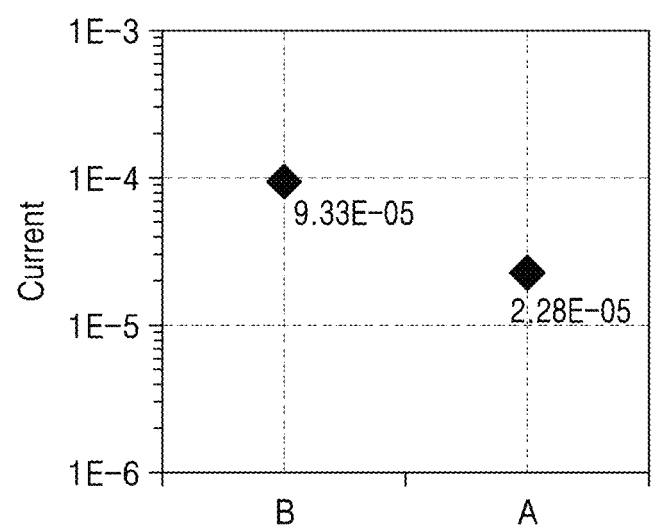
FIG. 5 is a graph showing the change in leakage current characteristics of an integrated circuit device, according to an embodiment.

Characteristics of the integrated circuit device 10 according to inventive concepts are described below. FIG. 4 is a graph showing the change in the concentration of a metal dopant according to a heat treatment in an experimental example of inventive concepts. FIG. 5 is a graph showing a comparison of a leakage current characteristic in experimental example A of inventive concepts with leakage current characteristics in comparative example B.

FIG. 4 shows the change in the concentration of the metal M before and after an annealing process ANL in the experimental example of inventive concepts.

Referring to FIG. 4, through the experimental example of inventive concepts, it is seen that when a heat treatment is performed at a certain temperature in the experimental example of inventive concepts, the metal M included in the supporter SPT (see FIG. 2) moves to the interface (corresponding to a point "0" on the X-axis of the graph of FIG. 4) between the supporter SPT and the capacitor dielectric film 180 (see FIG. 2).

For the heat treatment, the annealing process ANL was performed at a temperature of about 350° C. to about 500° C. When the concentrations of the metal M before and after the annealing process ANL are compared to one another, it is seen that the concentration of the metal M in the interface between the supporter SPT and the capacitor dielectric film 180 has increased after the annealing process ANL.

FIG. 5 shows the values of leakage current in experimental example A and comparative example B, according to whether metal doping is performed.

Referring to FIG. 5, through the comparison between experimental example A and comparative example B, it is seen that the value of leakage current has changed when a capacitor dielectric film was doped with the metal M.

When experimental example A, in which leakage current was measured in a capacitor dielectric film doped with the metal M, is compared with comparative example B, in which leakage current was measured in a capacitor dielectric film not doped with the metal M, it is seen that the leakage current decreases in experimental example A.

Figure 6:
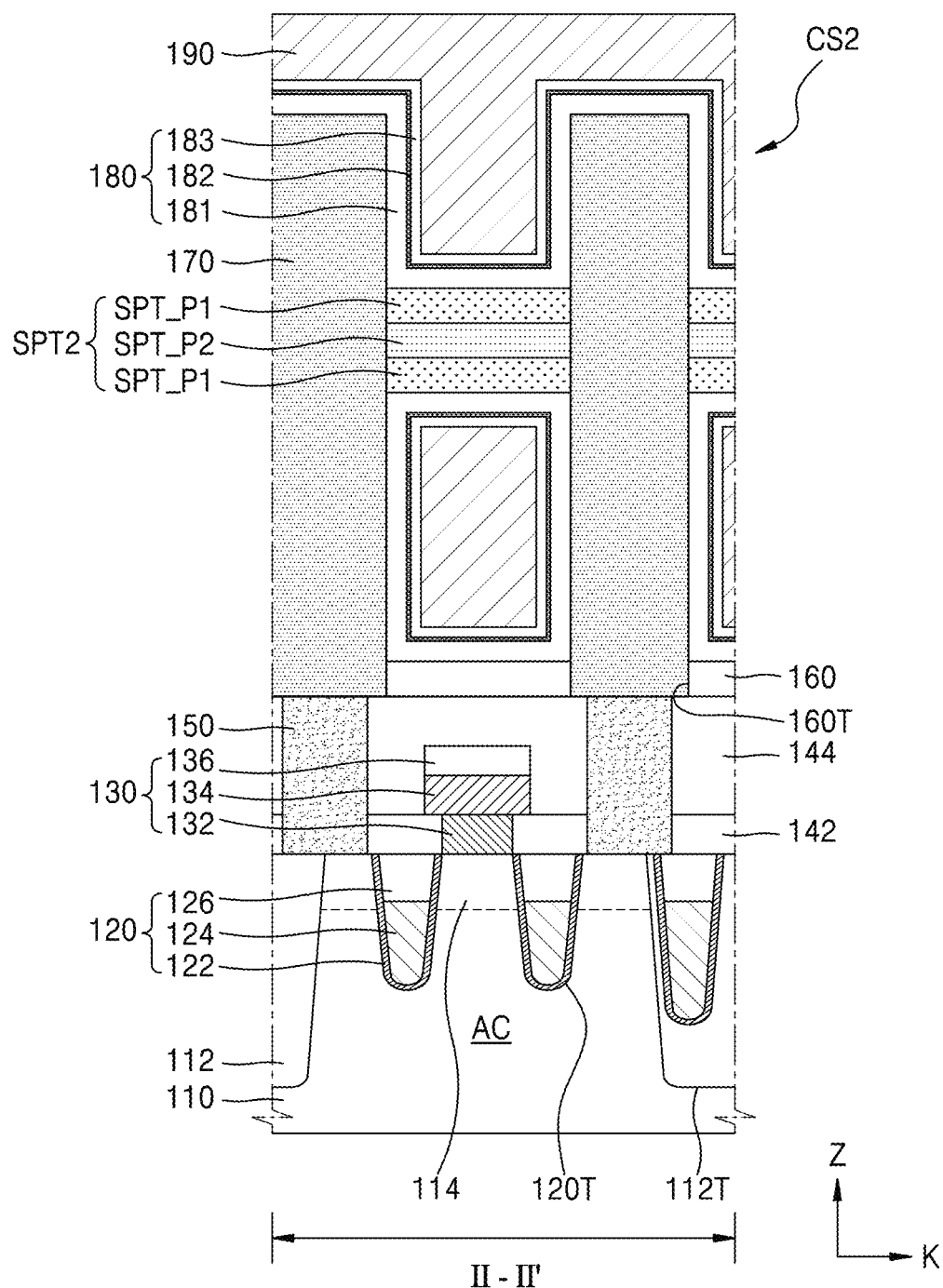
FIGS. 6 and 7 are cross-sectional views of integrated circuit devices according to embodiments.
Figure 7:
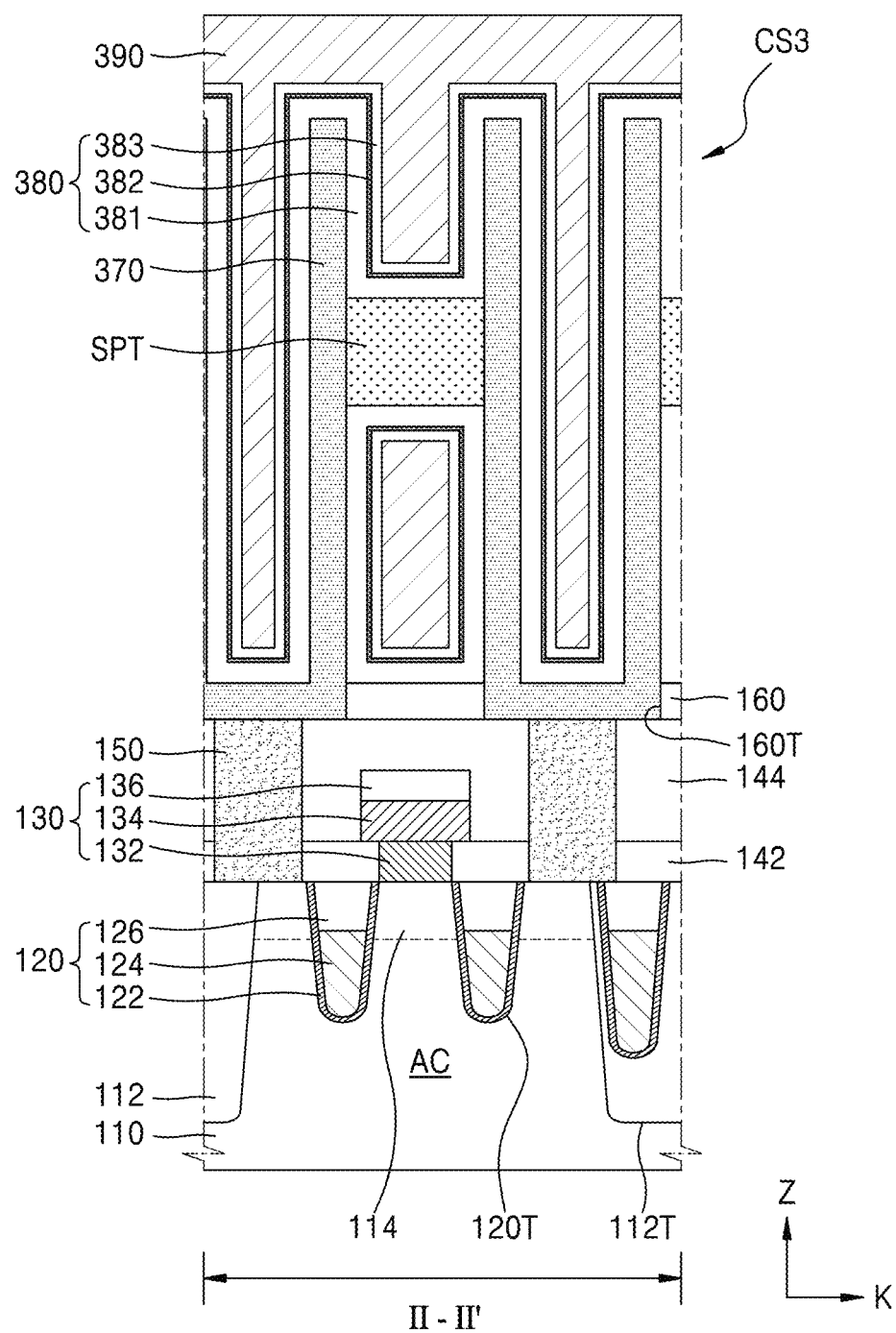

FIGS. 6 and 7 are cross-sectional views of integrated circuit devices 20 and 30 according to embodiments.

The elements of the integrated circuit devices 20 and 30 and the materials of the elements described below are mostly and substantially the same as or similar to those described above with reference to FIGS. 1 to 3. For convenience of description, therefore, the integrated circuit devices 20 and 30 are described focusing on the differences from the integrated circuit device 10.

Referring to FIG. 6, the integrated circuit device 20 may include the lower electrode 170 above the substrate 110, a supporter SPT2 supporting the lower electrode 170, the capacitor dielectric film 180 on the lower electrode 170, and the upper electrode 190 on the capacitor dielectric film 180.

In the integrated circuit device 20 according to the present embodiment, a capacitor structure CS2 may include the supporter SPT2. The supporter SPT2 may include a first supporter SPT_P1 and a second supporter SPT_P2.

The first supporter SPT_P1 may include a metal oxide, a metal nitride, or a metal oxynitride and may be in contact with the capacitor dielectric film 180. For example, the metal M included in the first supporter SPT_P1 may include at least one selected from Al, Si, Co, Mg, Ca, Y, Ta, Sn, Mo, Sr, La, Gd, and Zn.

The second supporter SPT_P2 may not include the metal M and may be surrounded by the first supporter SPT_P1 and thus not be in direct contact with the capacitor dielectric film 180. For example, the second supporter SPT_P2 may include silicon nitride.

The metal M included in the first supporter SPT_P1 may be diffused as a dopant into the capacitor dielectric film 180 such that the first dielectric film 181 of the capacitor dielectric film 180 may be doped with the metal M. The metal M may be thermally diffused into the first dielectric film 181 through the interface between the first supporter SPT_P1 and the first dielectric film 181.

In some embodiments, the first supporter SPT_P1 may be on each of the top and bottom surfaces of the second supporter SPT_P2. Each of the first and second supporters SPT_P1 and SPT_P2 may be in contact with the side walls of a plurality of lower electrodes 170, and the capacitor dielectric film 180 may be conformally formed on the outer surface of the first supporter SPT_P1 and the outer surfaces of the lower electrodes 170.

Referring to FIG. 7, the integrated circuit device 30 may include a lower electrode 370 above the substrate 110, the supporter SPT supporting the lower electrode 370, a capacitor dielectric film 380 on the lower electrode 370, and an upper electrode 390 on the capacitor dielectric film 380.

The lower electrode 370 of the integrated circuit device 30 may have a cylindrical or cup shape with a closed bottom on the contact structure 150.

A capacitor structure CS3 may include the lower electrode 370 electrically connected to the contact structure 150, the capacitor dielectric film 380 conformally covering the lower electrode 370, and the upper electrode 390 on the capacitor dielectric film 380.

When the lower electrode 370 has a cylindrical shape, the surface area of the lower electrode 370 corresponding to a storage electrode may be maximized, and accordingly, the capacitance of the capacitor structure CS3 may increase.

Figure 8:
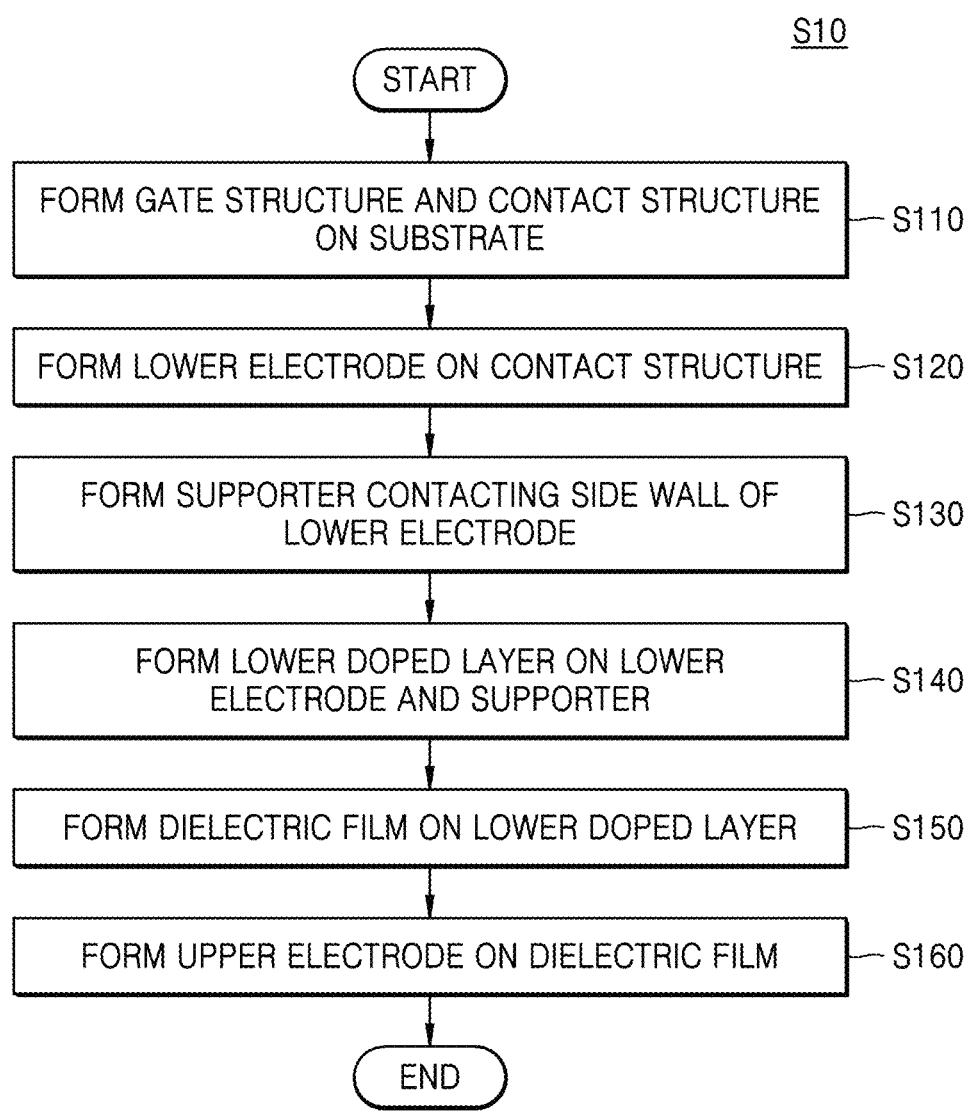
FIG. 8 is a flowchart of a method of manufacturing an integrated circuit device, according to an embodiment.

FIG. 8 is a flowchart of a method of manufacturing an integrated circuit device, according to an embodiment.

Referring to FIG. 8, a method S10 of manufacturing an integrated circuit device may include operations S110 to S160 performed sequentially.

When it is possible to modify an embodiment, the order of operations may be different from the order in which the operations are described. For instance, two operations described as being performed sequentially may be substantially performed simultaneously or in a reverse order.

The method S10 may include forming a gate structure and a contact structure on a substrate in operation S110, forming a lower electrode on the contact structure in operation S120, forming a supporter contacting a side wall of the lower electrode in operation S130, forming a capacitor dielectric film on the lower electrode and the supporter in operation S140, performing an annealing process on the substrate in operation S150, and forming an upper electrode on the capacitor dielectric film in operation S160.

The technical characteristics of operations S110 to S160 are described in detail below with reference to FIGS. 9 to 17.

FIGS. 9 to 17 are cross-sectional views of operations in a method of manufacturing an integrated circuit device, according to an embodiment.

For convenience of descriptions, FIGS. 9 to 17 are cross-sectional views taken along the line II-II' in FIG. 1.

Figure 9:
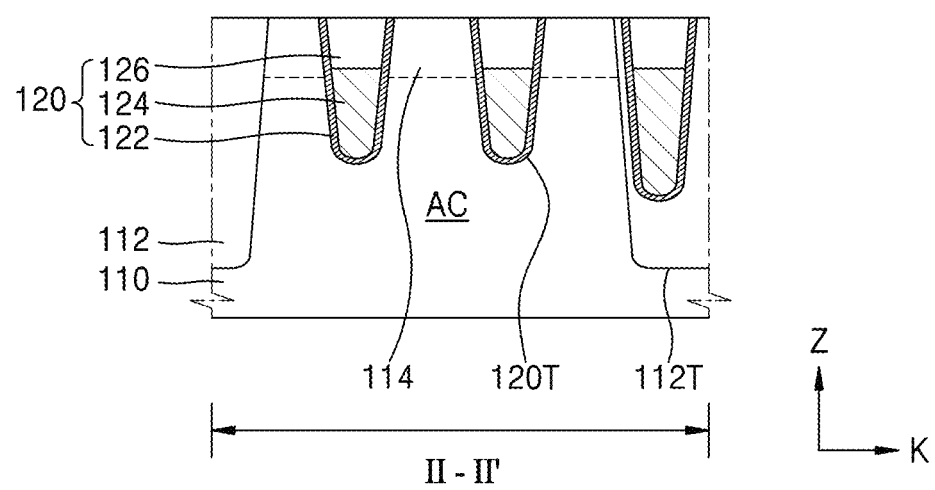
FIGS. 9 to 17 are cross-sectional views of operations in a method of manufacturing an integrated circuit device, according to an embodiment.

Referring to FIG. 9, the isolation trench 112T may be formed in the substrate 110, and the isolation film 112 defining the active region AC may be formed in the isolation trench 112T.

Subsequently, a mask pattern (not shown) may be formed on the substrate 110, and a plurality of gate line trenches 120T may be formed in the substrate 110 by using the mask pattern as an etch mask. The gate line trenches 120T may extend in parallel with each other, and each of the gate line trenches 120T may have a line shape crossing the active region AC.

Subsequently, the gate insulating layer 122 may be formed on the inner wall of each of the gate line trenches 120T. The gate electrode layer 124 may be formed by forming a gate conductive layer (not shown) on the gate insulating layer 122 to fill each gate line trench 120T and then removing an upper portion of the gate conductive layer to a certain height using an etch back process.

Subsequently, the gate capping layer 126 may be formed in the gate line trench 120T by forming an insulating material to fill the remaining portion of the gate line trench 120T and planarizing the insulating material to expose the top surface of the substrate 110. At this time, the mask pattern may be removed.

Subsequently, the source/drain region 114 may be formed by implanting impurity ions into a portion of the substrate 110 at each of opposite sides of the gate structure 120.

Alternatively, the source/drain region 114 may be formed on the active region AC by implanting impurity ions into the substrate 110 after the isolation film 112 is formed.

Figure 10:
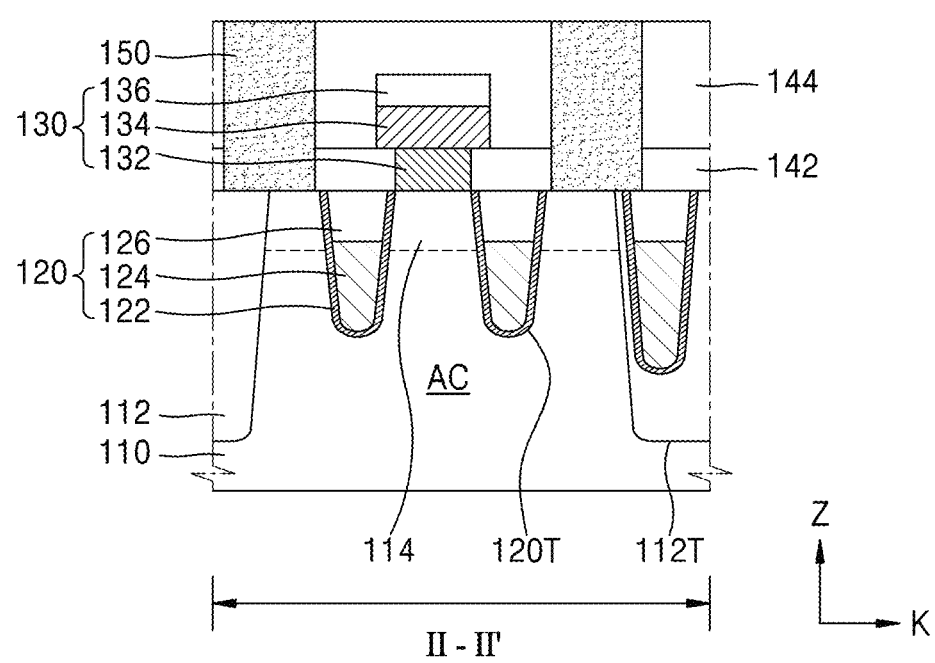

Referring to FIG. 10, the first interlayer insulating film 142 may be formed on the substrate 110, and an opening may be formed in the first interlayer insulating film 142 to expose a top surface of the source/drain region 114.

The bit line contact 132 electrically connected to the source/drain region 114 may be formed in the opening of the first interlayer insulating film 142 by forming a conductive layer on the first interlayer insulating film 142 to fill the opening of the first interlayer insulating film 142 and planarizing an upper portion of the conductive layer.

Subsequently, the bit line 134 and the bit line capping layer 136 may be formed to extend in the Y-direction, which is parallel with the top surface of the substrate 110, by sequentially forming a conductive layer and an insulating layer on the first interlayer insulating film 142 and then patterning the conductive layer and the insulating layer. Although not shown, a bit line spacer may be further formed on the side walls of the bit line 134 and the bit line capping layer 136.

Subsequently, the second interlayer insulating film 144 may be formed on the first interlayer insulating film 142 to cover the bit line 134 and the bit line capping layer 136.

Subsequently, an opening may be formed in the first and second interlayer insulating films 142 and 144 to expose the top surface of the source/drain region 114, and a contact structure 150 may be formed in the opening of the first and second interlayer insulating films 142 and 144. In some embodiments, the contact structure 150 may be formed by sequentially forming a lower contact (not shown), a metal silicide layer (not shown), and an upper contact (not shown) in the opening of the first and second interlayer insulating films 142 and 144.

Figure 11:
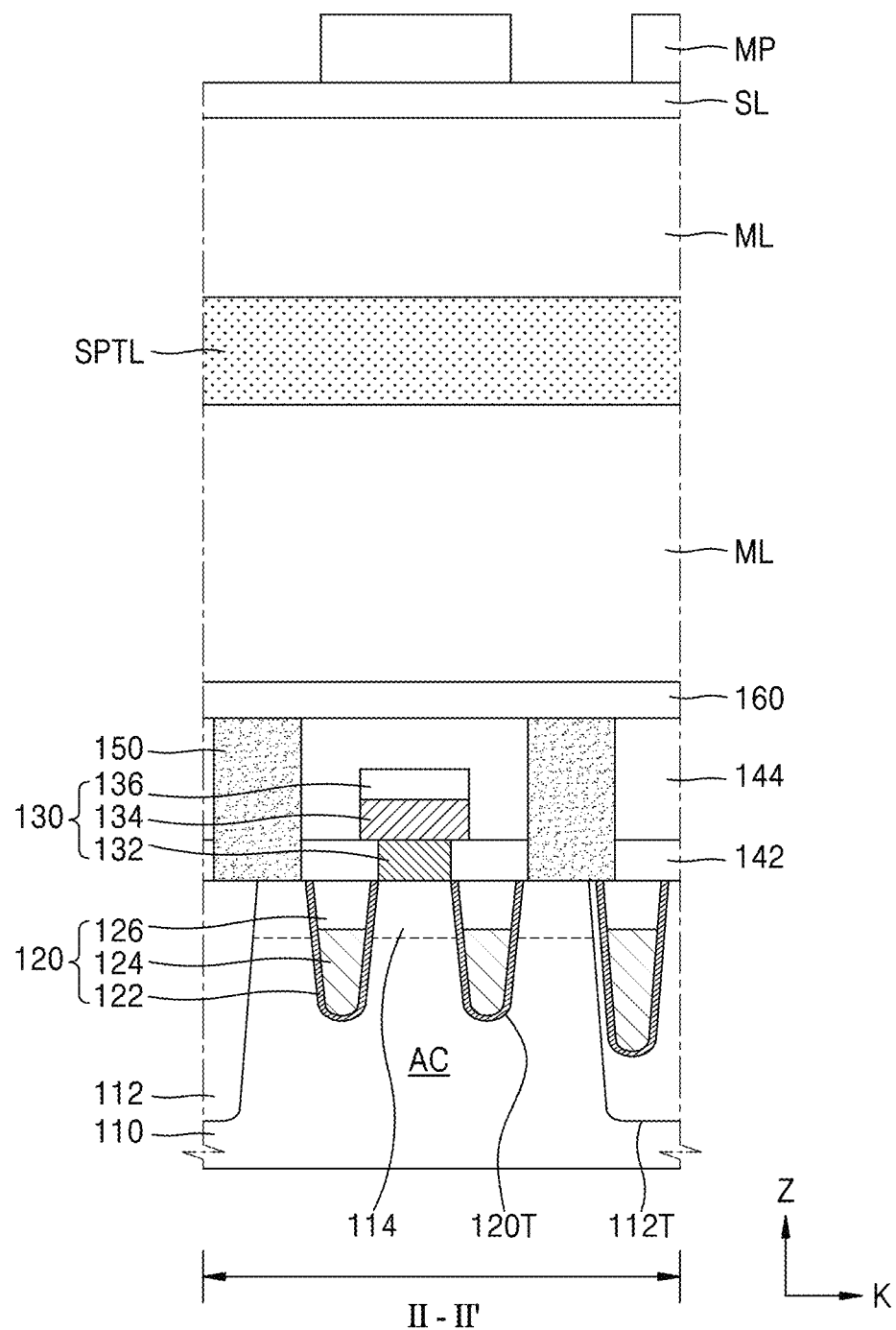
Figure 12:
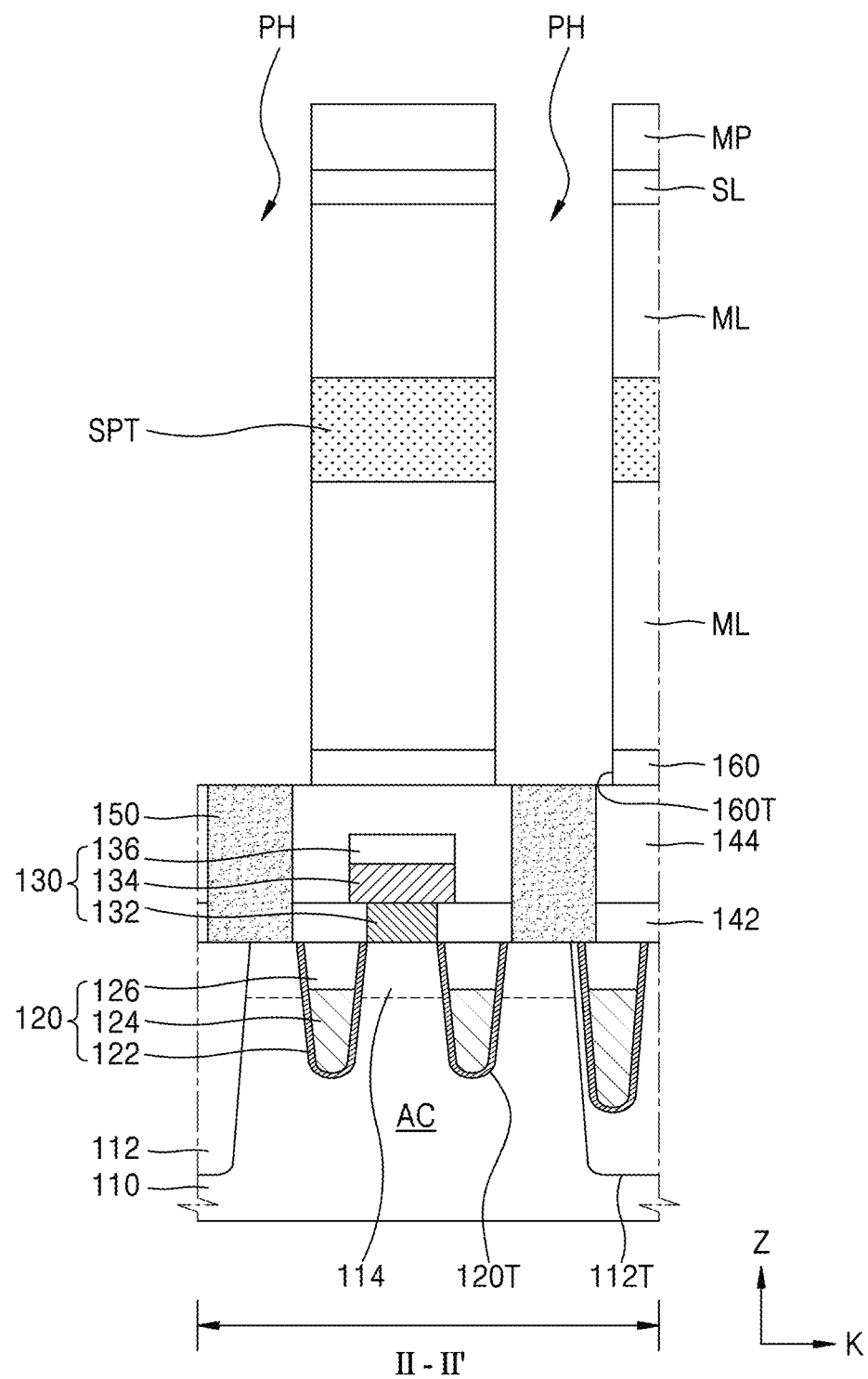

Referring to FIG. 11, the etch stop film 160, a mold layer ML, a supporter forming layer SPTL, and a sacrificial layer SL may be sequentially formed on the second interlayer insulating film 144 and the contact structure 150.

The mold layer ML may include silicon oxide. For example, the mold layer ML may be formed using a material, such as BPSG, spin on dielectric (SOD), PSG, PE-TEOS, or low pressure TEOS (LPTEOS). The mold layer ML may be formed to a thickness of about 500 nm to about 4000 nm but is not limited thereto.

Subsequently, the supporter forming layer SPTL may be formed in the mold layer ML. The supporter forming layer SPTL may include metal oxide, metal nitride, or metal oxynitride. The metal M included in the supporter forming layer SPTL may include at least one selected from Al, Si, Co, Mg, Ca, Y, Ta, Sn, Mo, Sr, La, Gd, and Zn.

Subsequently, the sacrificial layer SL may be formed on the mold layer ML. For example, the sacrificial layer SL may be formed using a material, such as TEOS, BPSG, PSG, USG, SOD, or high density plasma oxide (HDP). The sacrificial layer SL may be formed to a thickness of about 50 nm to about 200 nm but is not limited thereto.

Subsequently, a mask pattern MP may be formed by applying photoresist to the sacrificial layer SL and patterning the photoresist through exposure and development. A region, in which the lower electrode 170 (see FIG. 14) is to be formed, may be defined by the mask pattern MP. An anti-reflective coating (ARC) (not shown) may also be formed on the sacrificial layer SL.

Figure 15:
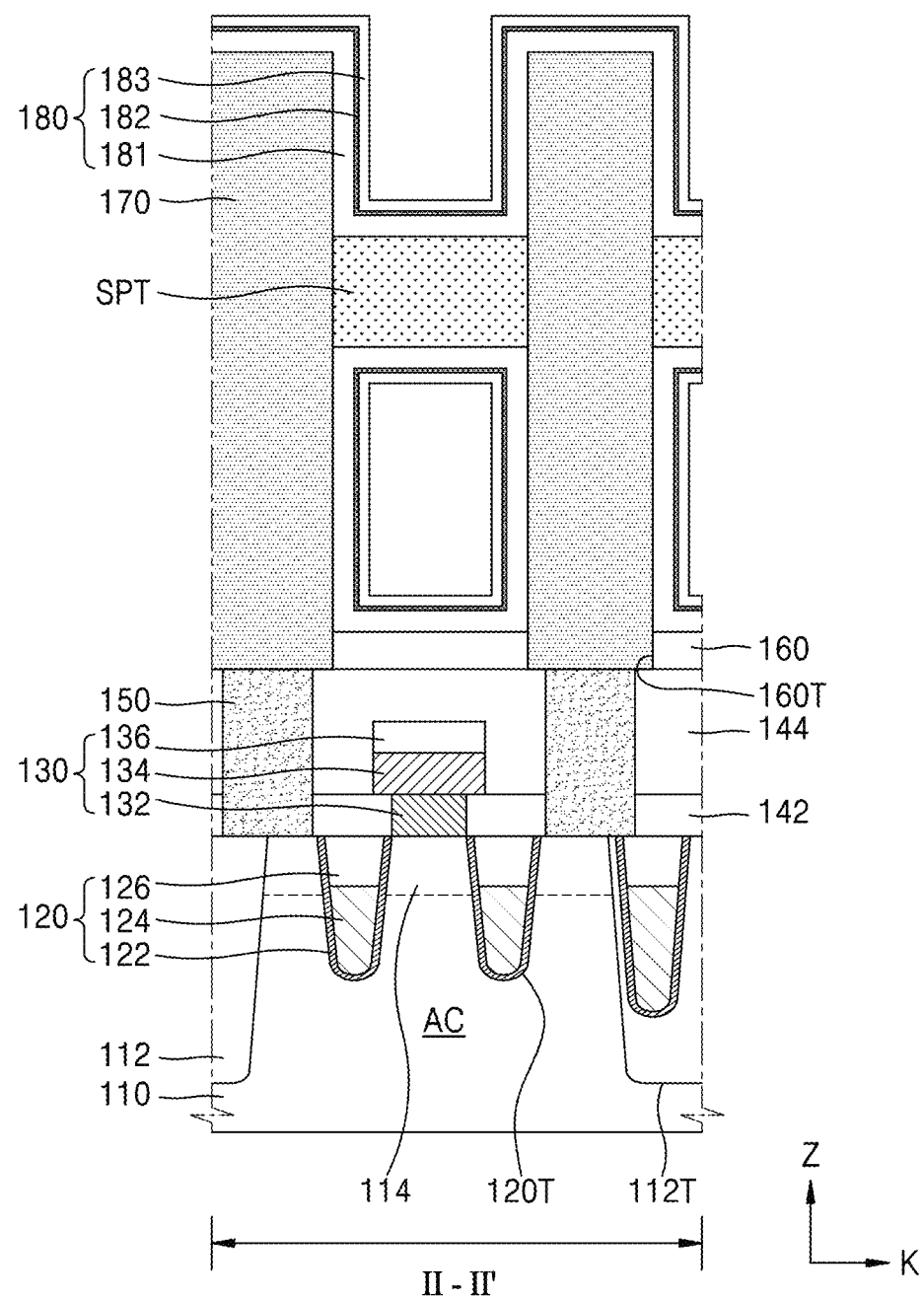

Referring to FIG. 15, a through hole PH may be formed by sequentially etching the sacrificial layer SL, the supporter forming layer SPTL, and the mold layer ML by using the mask pattern MP as an etch mask.

Subsequently, the opening 160T may be formed by removing a portion of the etch stop film 160, which is exposed at the bottom of the through hole PH. The top surface of the contact structure 150 may be exposed by the through hole PH and the opening 160T of the etch stop film 160.

Subsequently, the mask pattern MP may be removed by ashing and stripping processes.

Figure 13:
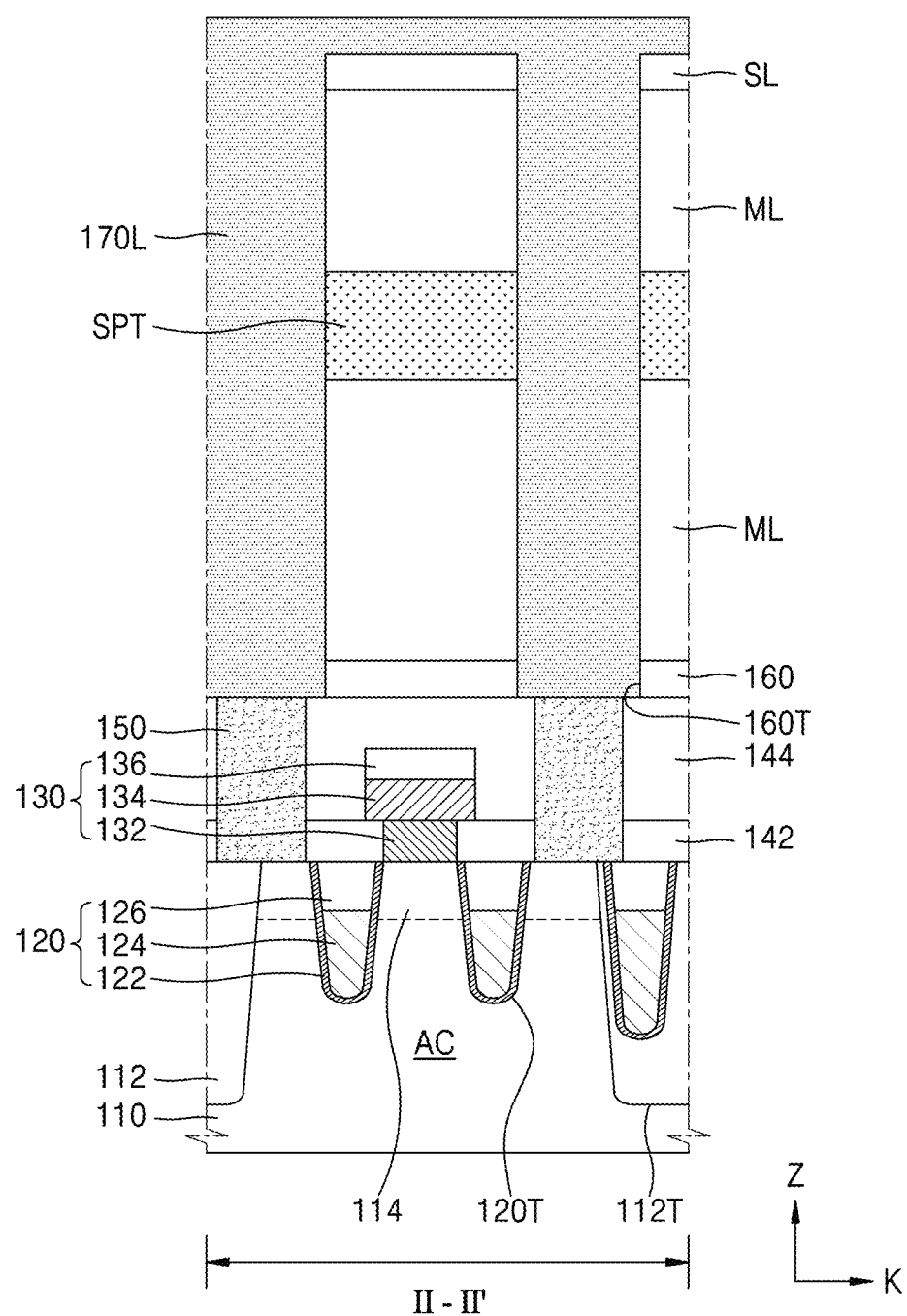

Referring to FIG. 13, a lower electrode forming layer 170L may be formed to conformally cover the inner walls of the through hole PH and the opening 160T of the etch stop film 160.

In some embodiments, the lower electrode forming layer 170L may be formed on the side surfaces of the etch stop film 160, the side surfaces of the mold layer ML, the side surfaces of the supporter forming layer SPTL, and the side and top surfaces of the sacrificial layer SL so as to be in contact with the top surface of the contact structure 150. For example, the lower electrode forming layer 170L may be formed using CVD or ALD.

Figure 14:
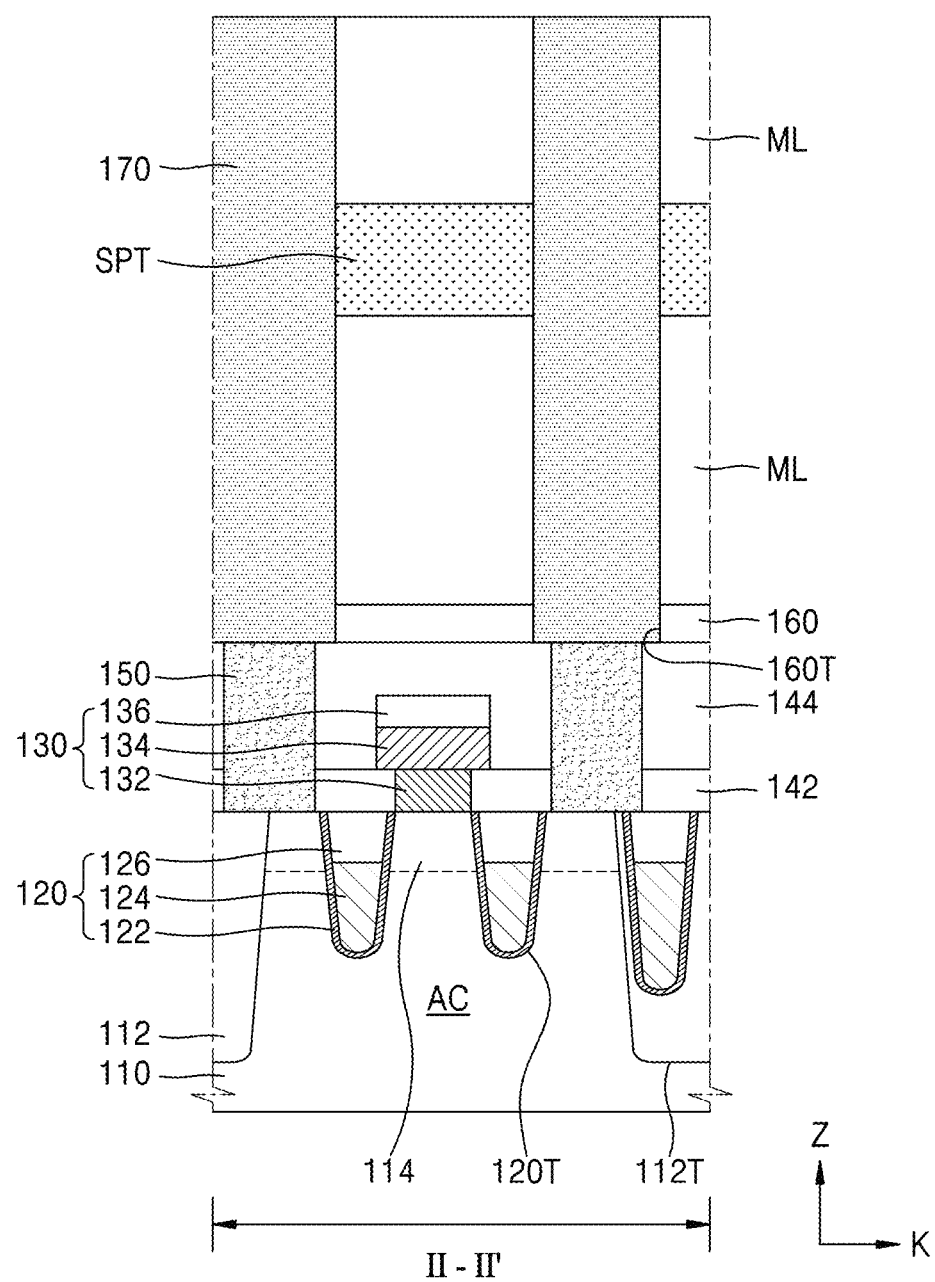

Referring to FIG. 14, the lower electrode 170 may be formed by removing a portion of the lower electrode forming layer 170L (see FIG. 13), which is above the top surface of the mold layer ML, and the sacrificial layer SL (see FIG. 13) by using a node separation process.

The node separation process may remove the sacrificial layer SL through etch back or chemical mechanical polishing (CMP).

Subsequently, the mold layer ML may be removed. For example, when the mold layer ML includes silicon oxide, the mold layer ML may be completely removed by a wet etching process using hydrofluoric acid or buffered oxide etchant (BOE).

During the wet etching process, the supporter SPT may not be etched but remain and firmly support the lower electrode 170, thereby limiting and/or preventing the lower electrode 170 from collapsing or breaking. The lower electrode 170 may be formed on the contact structure 150 to have a pillar shape extending in a Z-direction that is perpendicular to the top surface of the substrate 110.

Referring to FIG. 15, the capacitor dielectric film 180 may be formed by sequentially forming the first to third dielectric films 181, 182, and 183 on the lower electrode 170 and the supporter SPT.

The first and third dielectric films 181 and 183 may be formed using ALD so as to include $ZrO_2$, and the second dielectric film 182 may be formed using CVD or ALD so as to include $Al_2O_3$.

Figure 16:
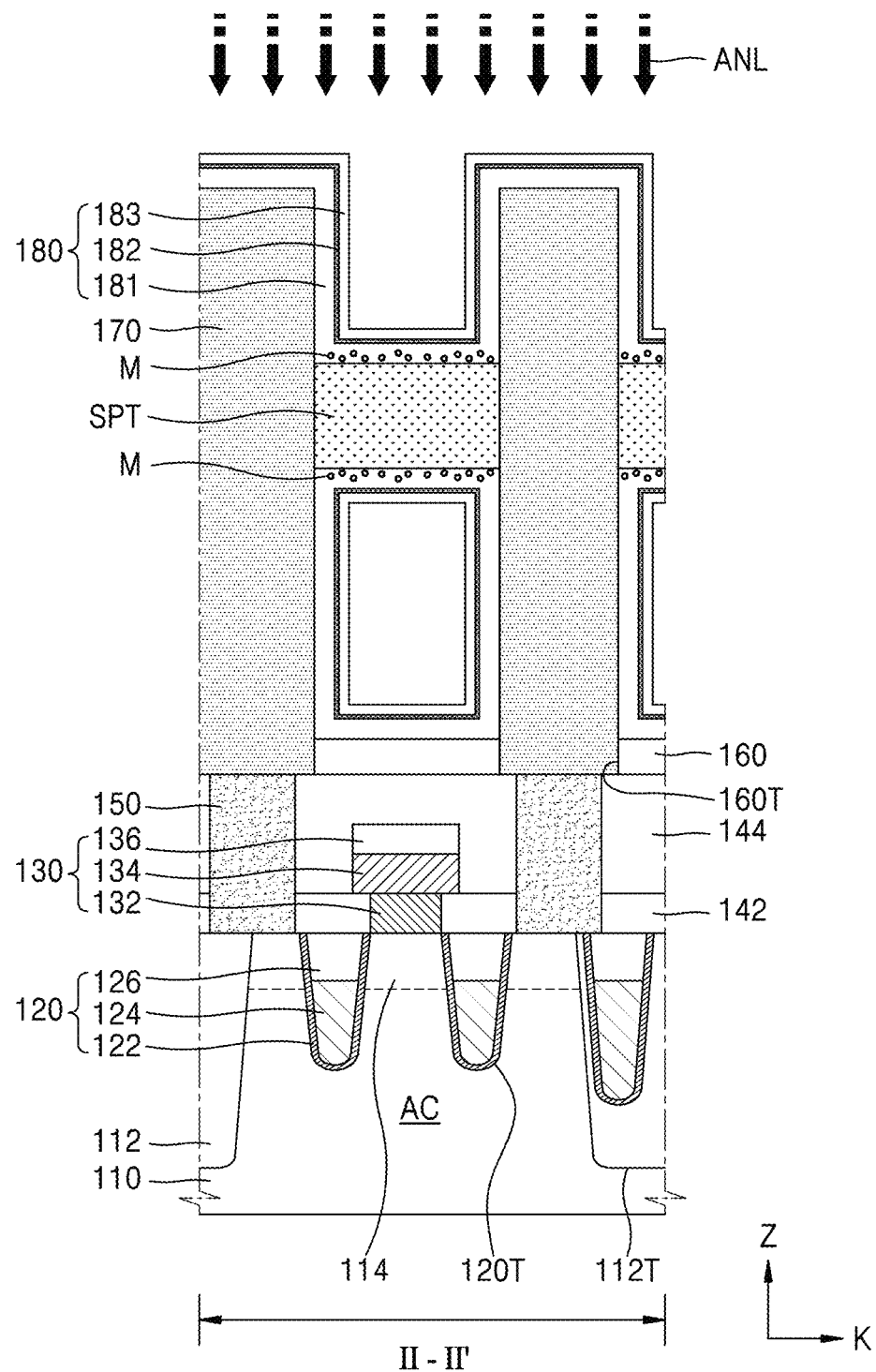

Referring to FIG. 16, the annealing process ANL may be performed on the substrate 110 with the capacitor dielectric film 180 formed thereon.

In some embodiments, the annealing process ANL may be performed at a temperature of about 350° C. to about 500° C. for about several minutes to about several hours but is not limited to these numerical values. During the annealing process ANL, the metal M included in the supporter SPT may be thermally diffused as a dopant into the capacitor dielectric film 180 such that a portion of the capacitor dielectric film 180 may be doped with the metal M.

Figure 17:
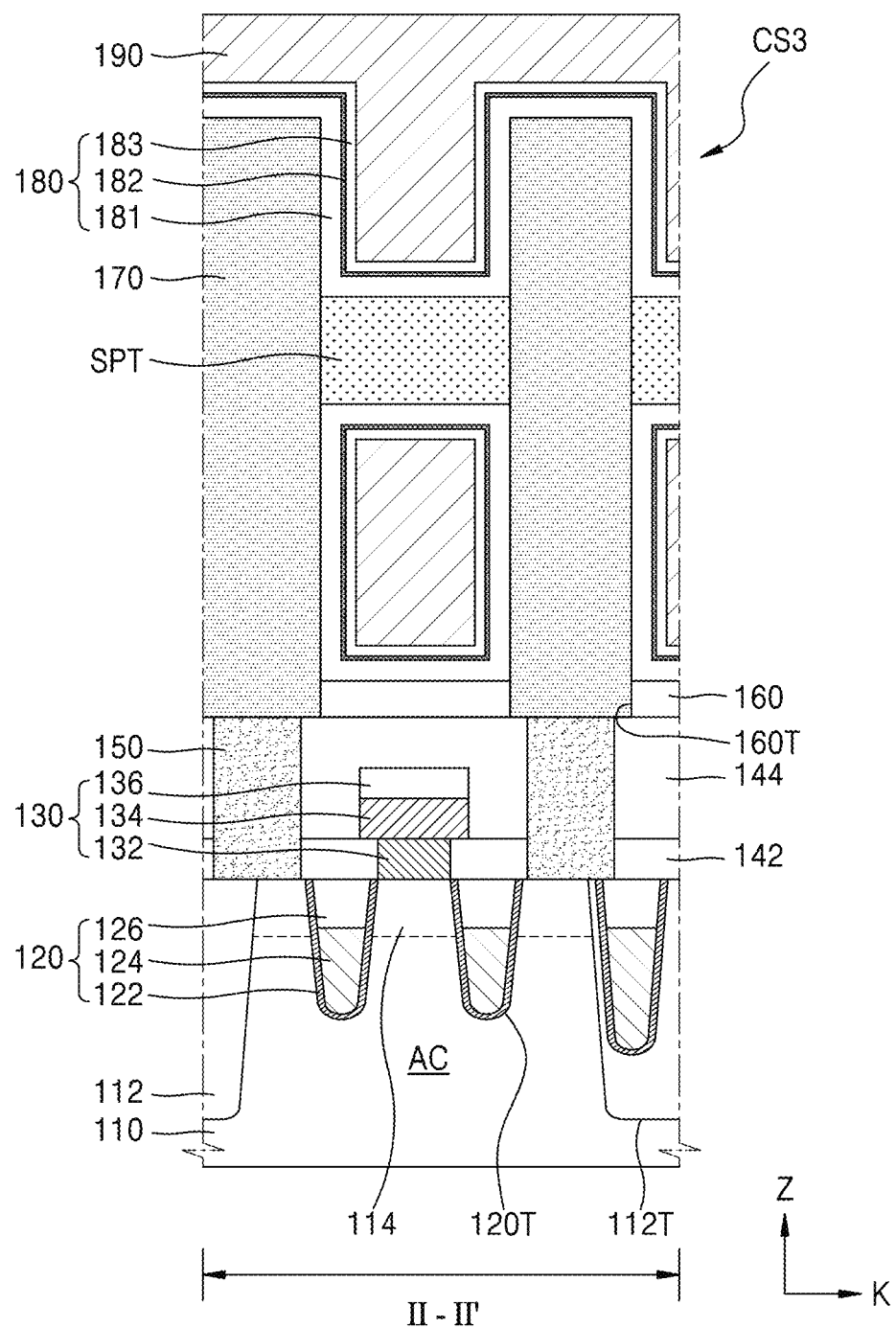

Referring to FIG. 17, the upper electrode 190 may be formed on the capacitor dielectric film 180.

The upper electrode 190 may be formed on the capacitor dielectric film 180 so as to completely fill the space defined by neighboring lower electrodes 170. The upper electrode 190 may be conformally formed on the capacitor dielectric film 180 to cover each lower electrode 170 with the capacitor dielectric film 180 between the upper electrode 190 and the lower electrode 170.

In some embodiments, the upper electrode 190 may be formed to be in direct contact with the third dielectric film 183. The upper electrode 190 may include metal nitride, metal, or a combination thereof. For example, the upper electrode 190 may include at least one selected from TiN, TaN, WN, Ru, Pt, and Ir.

The integrated circuit device 10 may be completely formed by sequentially performing the processes described above.

Eventually, in the integrated circuit device 10 according to inventive concepts, part of the metal M, which is a material included in the supporter SPT, may be diffused into the capacitor dielectric film 180, thereby reducing leakage current flowing through the capacitor dielectric film 180 between neighboring lower electrodes 170. Accordingly, the integrated circuit device 10 may have high capacitance and improved electrical characteristics.

Figure 18:
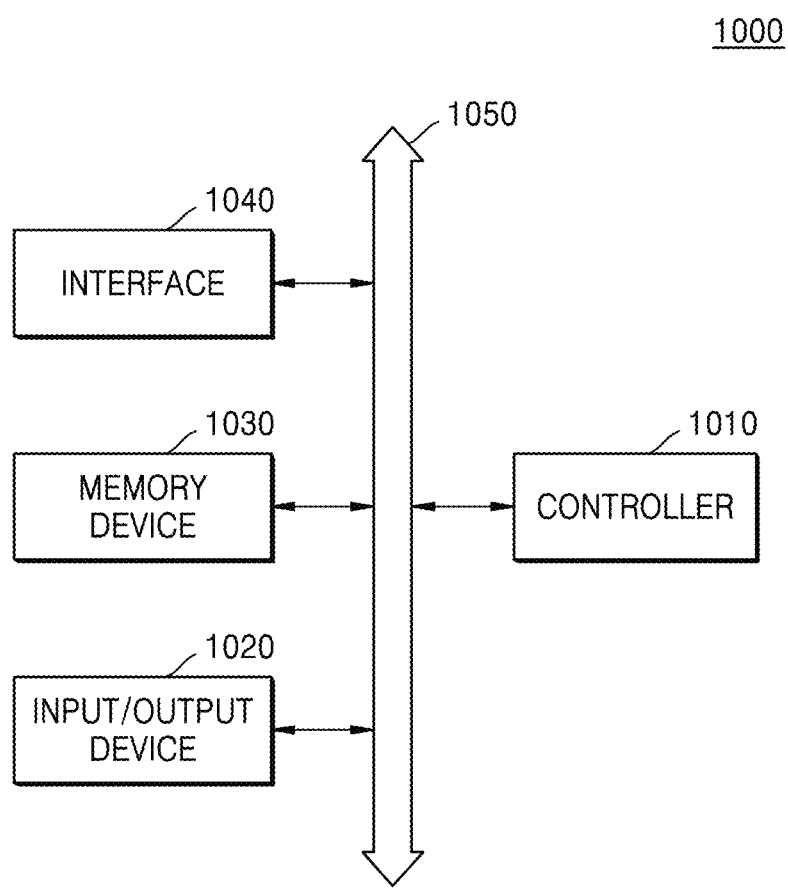
FIG. 18 is a block diagram of a system including an integrated circuit device, according to an embodiment.

FIG. 18 is a block diagram of a system 1000 including an integrated circuit device, according to an embodiment.

Referring to FIG. 18, the system 1000 may include a controller 1010, an input/output (I/O) device 1020, a memory device 1030, an interface 1040, and a bus 1050.

The system 1000 may include a mobile system or a system transmitting or receiving information. In some embodiments, the mobile system may include a portable computer, a web tablet, a mobile phone, a digital music player, or a memory card.

The controller 1010 may control an executable program in the system 1000 and include a microprocessor, a digital signal processor, a microcontroller, or the like.

The I/O device 1020 may be used for data input or output of the system 1000. The system 1000 may connect to and exchange data with an external device, e.g., a personal computer (PC) or a network, using the I/O device 1020. For example, the I/O device 1020 may include a touch screen, a touch pad, a keyboard, or a display.

The memory device 1030 may store data for the operation of the controller 1010 or data that has been processed by the controller 1010. The memory device 1030 may include the integrated circuit device 10, 20, or 30 described above according to inventive concepts.

The interface 1040 may correspond to a data transmission passage between the system 1000 and an external device. The controller 1010, the I/O device 1020, the memory device 1030, and the interface 1040 may communicate with one another through the bus 1050.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts has been particularly shown and described with reference to embodiments thereof, it will be understood that various changes in form and details may be made therein without departing from the spirit and scope of the following claims.

What is claimed is:

1. An integrated circuit device comprising:
a plurality of lower electrodes above a substrate;
a supporter between the plurality of lower electrodes;
an upper electrode on the plurality of lower electrodes; and
a capacitor dielectric film between the upper electrode and the plurality of lower electrodes, wherein
the supporter includes one of a metal oxide, a metal nitride, and a metal oxynitride,
a portion of the capacitor dielectric film includes a dopant, and
the dopant in the portion of the capacitor dielectric film and a metal in the supporter are a same metal.

2. The integrated circuit device of claim 1, wherein
the metal in the supporter includes at least one of aluminum (Al), silicon (Si), cobalt (Co), magnesium (Mg), calcium (Ca), yttrium (Y), tantalum (Ta), tin (Sn), molybdenum (Mo), strontium (Sr), lanthanum (La), gadolinium (Gd), and zinc (Zn).

3. The integrated circuit device of claim 2, wherein
the supporter is in contact with the capacitor dielectric film at an interface between the supporter and the capacitor dielectric film.

4. The integrated circuit device of claim 3, wherein
the portion of the capacitor dielectric film that includes the dopant is adjacent to the interface between the supporter and the capacitor dielectric film.

5. The integrated circuit device of claim 4, wherein a concentration of the metal in the portion of the capacitor dielectric film decreases as a distance increases away from the interface between the supporter and the capacitor dielectric film.

6. The integrated circuit device of claim 5, wherein
a region of the capacitor dielectric film adjacent to the upper electrode is not substantially doped with the same metal as the metal in the supporter.

7. The integrated circuit device of claim 5, wherein
the capacitor dielectric film includes a first dielectric material and a layer of a second dielectric material,
the second dielectric material is different than the first dielectric material, and
the layer of a second dielectric material is in a region of the capacitor dielectric film adjacent to the upper electrode.

8. The integrated circuit device of claim 7, wherein
the first dielectric material includes zirconium oxide ($ZrO_2$), and
the second dielectric material includes aluminum oxide ($Al_2O_3$).

9. The integrated circuit device of claim 1, wherein each of the plurality of lower electrodes has a pillar shape or a cylindrical shape and extends in a direction that is perpendicular to the substrate.

10. The integrated circuit device of claim 9, wherein
the supporter is in contact with a side wall of each of the plurality of lower electrodes, and
the capacitor dielectric film is conformally on an outer surface of the supporter and an outer surface of each of the plurality of lower electrodes.

11. An integrated circuit device comprising:
a plurality of lower electrodes above a substrate;
a supporter between the plurality of lower electrodes;
an upper electrode on the plurality of lower electrodes; and
a capacitor dielectric film between the upper electrode and the plurality of lower electrodes, wherein
the supporter includes a first supporter and a second supporter, the first supporter includes one of a metal oxide, a metal nitride, and a metal oxynitride, the first supporter is in contact with the capacitor dielectric film, the second supporter does not include metal, the second supporter is surrounded by the first supporter, the second supporter is not in contact with the capacitor dielectric film, a portion of the capacitor dielectric film includes a dopant, and the dopant in the portion of the capacitor dielectric film and a metal in the first supporter are a same metal.

12. The integrated circuit device of claim 11, wherein
the metal in the first supporter includes at least one of aluminum (Al), silicon (Si), cobalt (Co), magnesium (Mg), calcium (Ca), yttrium (Y), tantalum (Ta), tin (Sn), molybdenum (Mo), strontium (Sr), lanthanum (La), gadolinium (Gd), and zinc (Zn), and
the second supporter includes silicon nitride.

13. The integrated circuit device of claim 12, wherein
the portion of the capacitor dielectric film and the first supporter are in contact with each other through an interface between the first supporter and the capacitor dielectric film.

14. The integrated circuit device of claim 11, wherein
the first supporter is on each of a top surface of the second supporter and a bottom surface of the second supporter.

15. The integrated circuit device of claim 14, wherein
each of the first supporter and the second supporter are in contact with side walls of each of the plurality of lower electrodes, and
the capacitor dielectric film is conformally on an outer surface of the first supporter and outer surfaces of each of the plurality of lower electrodes.

16. An integrated circuit device comprising:
a substrate including an active region defined by an isolation film;
a gate structure on the substrate, the gate structure crossing the active region and extending in a first direction;
a source/drain in the active region at opposite sides of the gate structure, respectively;
a bit line structure on the substrate, the bit line structure extending in a second direction, the second direction being perpendicular to the first direction;
a plurality of contact structures on the source/drain, respectively;
a plurality of capacitor structures respectively on the plurality of contact structures,
the plurality of capacitor structures including a plurality of lower electrodes, respectively,
each of the plurality of capacitor structures including a corresponding lower electrode among the plurality of lower electrodes, a capacitor dielectric film, and an upper electrode; and
a supporter connecting and supporting the plurality of lower electrodes, wherein
the supporter includes one of a metal oxide, a metal nitride, and a metal oxynitride,
a portion of the capacitor dielectric film includes a dopant, and
the dopant in the portion of the capacitor dielectric film and a metal in the supporter are a same metal.

17. The integrated circuit device of claim 16, wherein
the metal in the supporter includes at least one of aluminum (Al), silicon (Si), cobalt (Co), magnesium (Mg), calcium (Ca), yttrium (Y), tantalum (Ta), tin (Sn), molybdenum (Mo), strontium (Sr), lanthanum (La), gadolinium (Gd), and zinc (Zn), and
the supporter is in contact with the capacitor dielectric film at an interface between the supporter and the capacitor dielectric film.

18. The integrated circuit device of claim 17, wherein
the capacitor dielectric film has a stack structure of a first dielectric film, a second dielectric film, and a third dielectric film,
the first dielectric film and the third dielectric film include zirconium oxide ($ZrO_2$),
the second dielectric film includes aluminum oxide ($Al_2O_3$),
an inside of the first dielectric film includes the dopant, and
an inside of each of the second dielectric film and the third dielectric film do not include the dopant.

19. The integrated circuit device of claim 16, wherein
the supporter includes a first supporter and a second supporter,
the first supporter includes one of the metal oxide, the metal nitride, and the metal oxynitride,
the first supporter is in contact with the capacitor dielectric film,
the second supporter includes silicon nitride,
the second supporter is surrounded by the first supporter, and
the second supporter is not in contact with the capacitor dielectric film.

20. The integrated circuit device of claim 16, wherein the metal reduces a flow of leakage current in the capacitor dielectric film between the plurality of lower electrodes.

* * * * *